(12) United States Patent
Bergstrom et al.

(10) Patent No.: US 12,338,098 B2
(45) Date of Patent: Jun. 24, 2025

(54) TAPE GUIDE FOR GUIDING A COMPONENT TAPE

(71) Applicant: Mycronic AB, Taby (SE)

(72) Inventors: Johan Bergstrom, Bromma (SE); Peter Sundstrom, Danderyd (SE)

(73) Assignee: Mycronic AB, Taby (SE)

( * ) Notice: Subject to any disclaimer, the term of this patent is extended or adjusted under 35 U.S.C. 154(b) by 208 days.

(21) Appl. No.: 17/768,081

(22) PCT Filed: Nov. 11, 2020

(86) PCT No.: PCT/EP2020/081768
§ 371 (c)(1),
(2) Date: Apr. 11, 2022

(87) PCT Pub. No.: WO2021/094377
PCT Pub. Date: May 20, 2021

(65) Prior Publication Data
US 2024/0083708 A1    Mar. 14, 2024

(30) Foreign Application Priority Data
Nov. 11, 2019 (EP) ..................................... 19208337

(51) Int. Cl.
*B65H 57/26* (2006.01)
*B65H 57/04* (2006.01)
*H05K 13/04* (2006.01)

(52) U.S. Cl.
CPC ............. *B65H 57/26* (2013.01); *B65H 57/04* (2013.01); *B65H 2402/51* (2013.01); *B65H 2701/37* (2013.01); *H05K 13/0419* (2018.08)

(58) Field of Classification Search
None
See application file for complete search history.

(56) References Cited

U.S. PATENT DOCUMENTS

| | | | | |
|---|---|---|---|---|
| 6,869,040 B2 * | 3/2005 | Eskang | ............. | H05K 13/0417 242/615.3 |
| 2002/0053136 A1 * | 5/2002 | Bergstrom | ......... | H05K 13/0417 29/701 |

(Continued)

FOREIGN PATENT DOCUMENTS

| EP | 1381265 A1 | 1/2004 |
|---|---|---|
| EP | 1438884 A1 | 7/2004 |
| WO | WO 00/38491 * | 6/2000 |

OTHER PUBLICATIONS

International Search Report PCT/ISA/210 for International Application No. PCT/EP2020/081768 dated Jan. 29, 2021.

*Primary Examiner* — William A. Rivera
(74) *Attorney, Agent, or Firm* — Harness, Dickey & Pierce, P.L.C.

(57) ABSTRACT

The present invention provides a tape guide for guiding a component tape from a tape reel to a picking position of a component mounting machine. The tape guide comprises a support structure arranged for guiding the component tape from an upstream end portion of the tape guide to a downstream end portion of the tape guide. The tape guide further comprised a hook portion arranged at the downstream end portion and configured to grip a flange of said tape reel when the tape guide and tape reel are removed from said component mounting machine. The present invention further provides a unit comprising a tape guide, a tape reel and component tape as well as component mounting machine.

13 Claims, 8 Drawing Sheets

(56) References Cited

U.S. PATENT DOCUMENTS

| | | | | |
|---|---|---|---|---|
| 2014/0318713 | A1* | 10/2014 | Wiley | H05K 13/0419 |
| | | | | 156/701 |
| 2018/0270998 | A1* | 9/2018 | Takada | H05K 13/02 |
| 2022/0046837 | A1* | 2/2022 | Jacobsson | H05K 13/0419 |
| 2023/0023441 | A1* | 1/2023 | Awano | H05K 13/02 |

* cited by examiner

TAPE GUIDE FOR GUIDING A COMPONENT TAPE

CROSS-REFERENCE TO RELATED APPLICATIONS

This application is a national phase under 35 U.S.C. § 371 of PCT International Application No. PCT/EP2020/081768 which has an International filing date of Nov. 11, 2020, which claims priority to EP Application Serial No. 19208337.6, filed Nov. 11, 2019, the entire contents of each of which are hereby incorporated by reference.

TECHNICAL FIELD

The present inventive concept relates to the field of pick and place technology. More particularly, it relates to tape guide for guiding a tape of electronic components used in pick and place technology.

BACKGROUND

Generally, within the field of manufacture and assembly of circuit boards, electronic components are often delivered spaced apart along the length of a component tape. These are fed to a component mounting machine, such as a machine for pick-and-place, for mechanically and/or electrically mounting of components on a workpiece, which may be a Printed Circuit Board (PCB) or a substrate for a System in Package (SiP).

The expression "pick and place" may be understood by the person skilled in the art as describing the very mounting operation where a mounting head is moved to a component feeder area, where the mounting head picks one or more components from one or more of the component feeders, and then is moved to a mounting area where the mounting head places the component or components on a workpiece, such as printed circuit board (PCB).

The component tape may be formed of a lower carrier tape comprising compartments accommodating the electronic components, and an upper, protective cover keeping the electronic components in place. The component tape may be wound on a reel and stored in a magazine configured to be inserted into the component mounting machine. The free end of the component tape may be introduced into a feeding mechanism of the component mounting machine, often referred to as a component feeder, tape feeder or tape guide, configured to guide the component tape to a picking position in which the component is exposed to a picking tool of the component mounting machine. The component on the tape may be available for the picking tool by means of an exposure member of such a component feeder that removes the cover from the carrier tape as the component tape is fed towards the picking position.

However, when a loaded component feeder together with the tape reel is removed from a magazine of the component mounting machine, or is to be inserted into a magazine of the component mounting machine, the feeder and the tape reel are basically only connected via a strip of the component tape that is wound onto the reel. Therefore, conventional component feeders may have a reel holder for use both in the component mounting machine as well as outside the machine. Normally such a holder consists of a center hub pin and is made large enough to hold also the largest possible reels.

However, this makes the whole feeder and holder mechanism huge and space consuming and therefore also expensive.

There is thus a need in the art for a more efficient and user-friendly handling of component feeders and tape reel when these are not mounted in a component mounting machine.

SUMMARY

It is an object of the invention to at least partly overcome one or more limitations of the prior art. In particular, it is an object to provide a tape guide that facilitates storing and handling of a tape reel together with a tape guide when these are removed from a component mounting machine.

As a first aspect of the invention, there is provided a tape guide for guiding a component tape from a tape reel to a picking position of a component mounting machine, said tape guide comprising
 a support structure arranged for guiding the component tape from an upstream end portion of the tape guide to a downstream end portion of the tape guide;
 and wherein the tape guide further comprises
 a hook portion arranged at the downstream end portion and configured to grip a flange of said tape reel when the tape guide and tape reel are removed from said component mounting machine.

The component mounting machine may be a pick and place (PnP) machine, such as a PnP machine for mounting electronic components on a Printed Circuit Board (PCB). The component tape may be a carrier tape comprising the component compartments, in which there may be electronic components stored. Thus, the components may be electronic components. The electronic components include for example resistors, capacitors and transistors. The component tape is usually stored on a tape reel and during operation, the tape guide is used for guiding the component tape from such a reel to a picking position of the component mounting machine.

The tape guide may in itself have an active feeding mechanism for transporting the component tape from the tape reel, i.e. the tape guide may be a tape feeder for both feeding and guiding the component tape. However, the actual feeding mechanism may be performed by other parts of the component mounting machine, whereas the tape guide may be configured for guiding the component tape that is fed by these other parts to the picking position.

The support structure may be understood as a structure on which the component tape may slide as it is fed towards the picking position. The support structure may for example be arranged to support the underside of the component tape being guided. The support structure may be configured to support the component tape in a vertical direction, i.e., the direction in which the picking tool may move when picking the component, and/or in a lateral direction, i.e., a sideway direction with reference to the feeding direction of the component tape. The tape guide is further arranged for guiding the component tape from an upstream end portion of the tape guide to a downstream end portion of the tape guide, thus defining a feeding direction on the tape guide. Thus, by feeding direction is meant the direction in which the component tape is fed towards the picking position, whereas lateral direction refers to a width direction of the component tape.

The tape guide further comprises one or several hook portions that are configured for attachment or for gripping a flange of a tape reel, i.e. the tape reel for the tape that the tape guide is arranged for guiding. A tape reel may be configured such that lengths of a component tape may be wound around a core portion of the reel for storage. The core portion may be sandwiched between two disc members, such as between two circular discs, for protection of the component tape during storage. The hook portion of the tape guide may thus be arranged for gripping the outer periphery of such disc members, i.e. for gripping the flanges of such disc members of the tape reel.

The hook portion is configured to grip a flange of the tape reel when the tape guide and tape reel are removed from said component mounting machine. In other words, the hook portion is configured to grip a flange of the tape reel when the reel and tape guide are not mounted in a component mounting machine, such as during manual or automatic transport to and from a component mounting machine.

In embodiments of the first aspect, the hook portion is arranged for gripping a single flange of the tape reel. However, in embodiments, the hook portion is arranged for gripping both flanges of a tape reel.

The first aspect of the invention is based on the insight that using a hook portion for securing the tape guide to the tape reel makes the handling of tape reel and tape guide more convenient for an operator and during storage of the tape reel and the tape guide. Further, if the tape guide at least has a hook portion on the downstream portion, this portion can be attached to a tape reel. This is advantageous in that it allows for a relaxed state of the component tape, thereby decreasing the risk for folds on the component tape during storage and handling. Folds increases the risk of damage of the components that are to be used in the mounting machine and the risk of an unsuccessful pick procedure. For comparison, the inventor has found that only having a hook portion on the upstream end portion of the tape guide may induce a fold in the component tape, especially when there is little tape left on wound on the tape reel.

In embodiments of the first aspect of the invention, the tape guide is arranged for guiding a component tape comprising a carrier tape and a cover, in which the carrier tape comprises a plurality of sequentially arranged compartments carrying components to be mounted by the component mounting machine. The carrier tape comprises a plurality of compartments, which also may be referred to as pockets for accommodating components. The compartments may be distributed along the component tape, and thus the feeding direction, in an equidistant sequence. The cover may be considered as arranged above or on the carrier tape. Consequently, the carrier tape may be considered as arranged below or under the cover.

Moreover, the tape guide may comprise an exposure member configured to separate the cover from the carrier tape such that the components are exposed at the picking position of the component mounting machine. Such an exposure member may be arranged above the component tape during operation, such that it can engage and at least partly remove the cover from the carrier tape before the tape reaches the picking position in the component mounting machine. The exposure member may hence be arranged upstream the picking position, as seen in the feeding direction.

In embodiments of the first aspect of the invention, the hook portion is arranged on an outer surface of the support structure.

Having a hook portion on the outer surface may thus increase handling and attachment of the tape guide to a tape reel.

In embodiments of the first aspect, the hook portion and the outer surface of the support structure define a receiving slit for a flange of said tape reel between the hook portion and the outer surface of the support structure when the hook portion grips a flange of said tape reel, and wherein the receiving slit extends in the direction (D) between said upstream and downstream end portions of the tape guide.

Thus, the hook portion may be arranged such that the flange of a tape reel is received in a receiving slit of the hook portion. The receiving slit may be formed between the hook portion and the support structure of the tape guide, or between two parallel surfaces of the hook portion. The receiving slit is arranged in the same direction as the length of the tape guide, i.e. between the upstream and downstream end portions of the tape guide, which thereby decreases the risk of folds in a component tape when the tape guide is attached to a flange of a tape reel.

As an example, the receiving slit may have at least one rough inner surface for increasing the friction against the surface of a reel flange.

Thus, the surfaces in between which the receiving slit is formed may have a surface roughness that is high enough for increasing the friction against the surface of the flange of the tape reel. Thus, the surfaces defining the slit may not be smooth surfaces.

The surfaces defining the receiving slit may for example comprise protruding elements that protrude at least 100 μm, such as at least 500 μm, such as at least 1 mm. The protruding elements may be in the form of micro-spikes. Further, the surfaces defining the receiving slit may be of a hard material, such as a metal.

In embodiments of the first aspect, the hook portion is spring loaded at the downstream end portion of the tape guide.

The hook portion may thus be arranged to squeeze the flange when attached to a tape reel.

The hook portion may thus be spring loaded such that a gripping or pressing force is exerted to the flange of the tape reel when the tape guide is attached to the tape reel. Thus, the hook portion may be configured to be in a resting position when the tape guide is not attached to a tape reel and be configured to exert an opposing force proportional to the distance the hook portion is extended while gripping the flange, e.g. proportional to the width of the flange of the tape reel.

Thus, a receiving slit may be formed only during attachment to the tape reel and not when the hook portion is in a resting position.

As an example, the hook portion may be a flexible portion of the support structure. The support structure may for example be a flexible portion of the outer surface of the support structure that is bendable out from the outer surface such that it may be attached to the flange of a reel. Such a flexible hook portion, and also the support structure, may for example be of a plastic material.

As a further example, the hook portion may be a separate piece that is spring loaded with a spring member at the downstream end portion of the tape guide.

Thus, the tape guide may comprise a separate spring member that is arranged for spring loading the hook portion. The spring member may for example be a coiled spring. A spring loaded hook portion is advantageous in that it may be used for attachment to different tape reels having flanges of different thicknesses.

In embodiments of the first aspect of the invention, the hook portion is a protruding portion of the support structure forming a permanent receiving slit for a flange of said tape reel.

Thus, the hook portion may be configured such that there is a permanent slit also when the tape guide is in a resting position, i.e. when not attached to a tape reel.

In embodiments of the first aspect of the invention, the hook portion is a separate piece that is attached to the support structure via at least one hinge portion.

Thus, the tape guide may comprise at least one hinge portion arranged for supporting a hinged hook portion. In other words, the hook portion may be arranged for being pulled out from the outer surface of the tape guide. The tape guide may thus be configured to be in two permanent operational positions; an attaching position in which the hook portion is extended outwards from the outer surface of the tape guide via the at least on hinge and thereby able to grip the flange of a tape reel, and a resting position in which the hook portion is retracted to or into the outer surface of the tape guide.

The hook portion attached via a hinge portion may also be spring loaded, e.g. via a separate spring member. The spring member may be a coiled spring.

In embodiments of the first aspect of the invention, the hook portion comprises a magnet arranged for increasing the grip strength to a flange of said tape reel.

Such a magnet could be arranged on or behind a surface of the hook portion that is in contact with the flange when gripping the tape reel.

The tape guide of the first aspect may comprise a single hook portion. In an embodiment of the first aspect, the tape guide comprises a single hook portion configured to grip a flange of said tape reel, and wherein said single hook portion is arranged at the downstream end portion of said tape guide.

However, it is to be understood that the tape guide may comprise at least two hook portions. As an example, the tape guide may comprise a hook portion at the downstream end portion of the tape guide and a hook portion at the upstream end portion of the tape guide. The hook portions may be arranged for gripping different flanges of the tape reel. For example, the tape guide may comprise a first hook portion arranged for gripping a first flange of a tape reel and a second hook portion for gripping a second flange, other than the first flange, of the tape reel.

As a second aspect of the invention, there is provided a unit for guiding a component tape to a picking position of a component mounting machine, the unit comprising a tape reel;

a tape guide according to the first aspect of the invention; and a component tape wound around said tape reel and guided into the tape guide at the upstream end portion of said tape guide.

This aspect may generally present the same or corresponding advantages as the former aspect. Effects and features of this second aspect are largely analogous to those described above in connection with the first aspect. Embodiments mentioned in relation to the first aspect are largely compatible with the second aspect.

The unit may be arranged for being releasably mounted in a magazine or storage bin in a component mounting machine. Such a magazine may be arranged for receiving a plurality of units of the second aspect.

In embodiments of the second aspect, the hook portion of the tape guide grips a flange of said tape reel. As the hook portion grips the flange, the tape guide is releasably attached to the tape reel.

As a third aspect of the invention, there is provided a component mounting machine comprising at least one unit according to second aspect releasably mounted in said component mounting machine.

This aspect may generally present the same or corresponding advantages as the former aspects. Effects and features of this third aspect are largely analogous to those described above in connection with the first and second aspects. Embodiments mentioned in relation to the first and second aspects are largely compatible with the third aspect.

The component mounting machine may be a pick and place (PnP) machine, such as a PnP machine for mounting electronic components on a Printed Circuit Board (PCB).

The component mounting machine may comprise a plurality of magazines into which the units, i.e. tape reel and tape guide, are releasably attached.

BRIEF DESCRIPTION OF THE DRAWINGS

The above, as well as additional objects, features and advantages of the present inventive concept, will be better understood through the following illustrative and non-limiting detailed description, with reference to the appended drawings. In the drawings like reference numerals will be used for like elements unless stated otherwise.

FIG. 4a an illustration of a tape guide according to an embodiment of the present invention.

FIG. 4b shows an exploded view of the hook portion of the tape guide shown in FIG. 4a.

DETAILED DESCRIPTION

Figure 1:
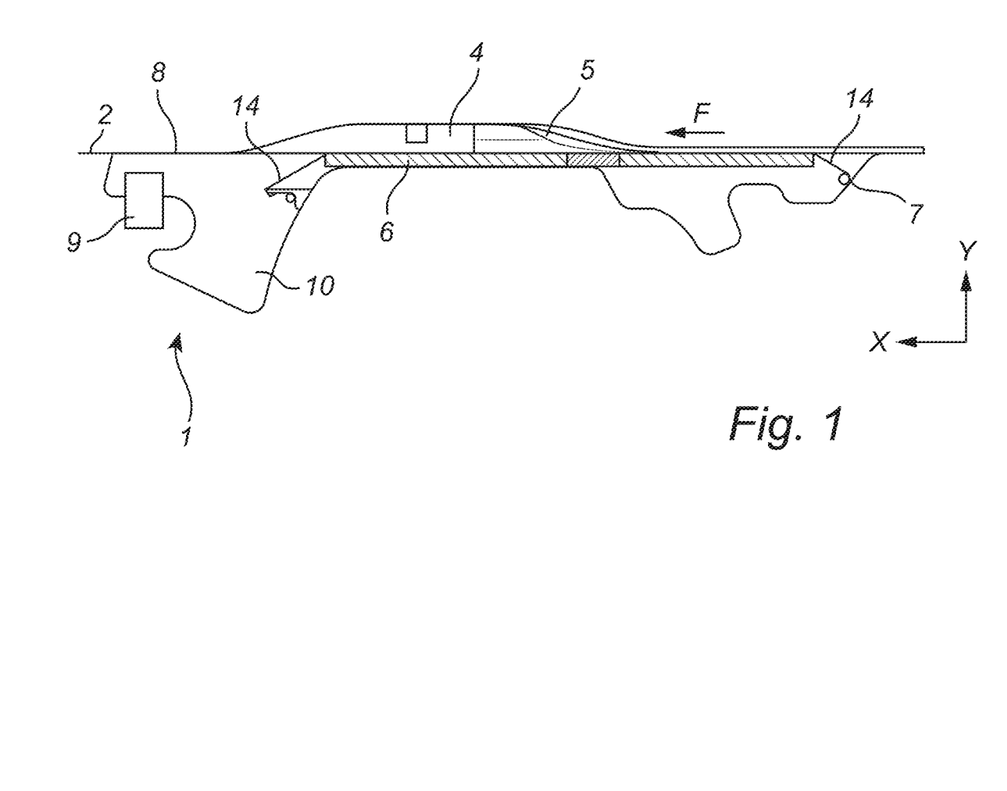
FIG. 1 is an illustration of a tape guide according to an embodiment of the present invention.

FIG. 1 shows a side view of a tape guide 1 according to an embodiment. The tape guide 1 handles a portion of a component tape 2 by feeding it to a picking position 4 for a component mounting machine (not shown). The picking position 4 defines the location where the components of the component tape 2 may be picked by the picking tool of the component mounting machine. The tape guide 1 is configured for guiding the component tape in a feeding direction as indicated by represented by the x-axis (horizontal axis) F, i.e. from an upstream portion 7 to a downstream end portion 8 of the tape guide 1.

The tape guide 1 of FIG. 1 further comprises an exposure member 5 positioned upstream of the picking position 4 when looking in the feeding direction F, in FIG. 1. The tape guide 1 illustrated in FIG. 1 also comprises a support structure 6 positioned under a portion of the component tape 2, the picking position 4 and the exposure member 5 during operation. The support structure 6 may comprise a magnet (not shown) arranged within the support structure 6 or attached to the support structure 6. The magnet may be positioned so that it aligns with the exposure member 5. The support structure 6 may be of a flat spring design, and may be provided with hooks 14 at its ends, allowing the support structure 6 to be releasably attached to the tape guide 1.

During operation, the component tape 2 may be moved along the feeding direction F (x-axis in FIG. 1), passing the exposure member 5 which allows components of the component tape 2 to be ready for picking at the picking position 4. The support mechanism 6, e.g. together with a spring (not shown) may exert vertical forces (i.e. along the y-axis in FIG. 1) on the component tape 2 so as to improve the positioning accuracy at the picking position 4 and reduce the risk of the exposure member 5 sliding off the component tape 2.

Figure 2A:
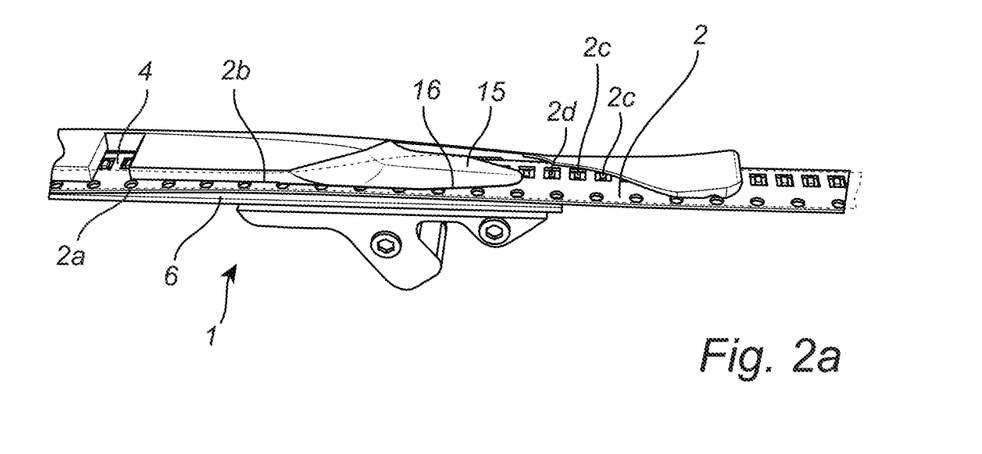
FIGS. 2a and 2b are illustrations of a portions of a tape guide according to an embodiment of the present invention.
Figure 2B:
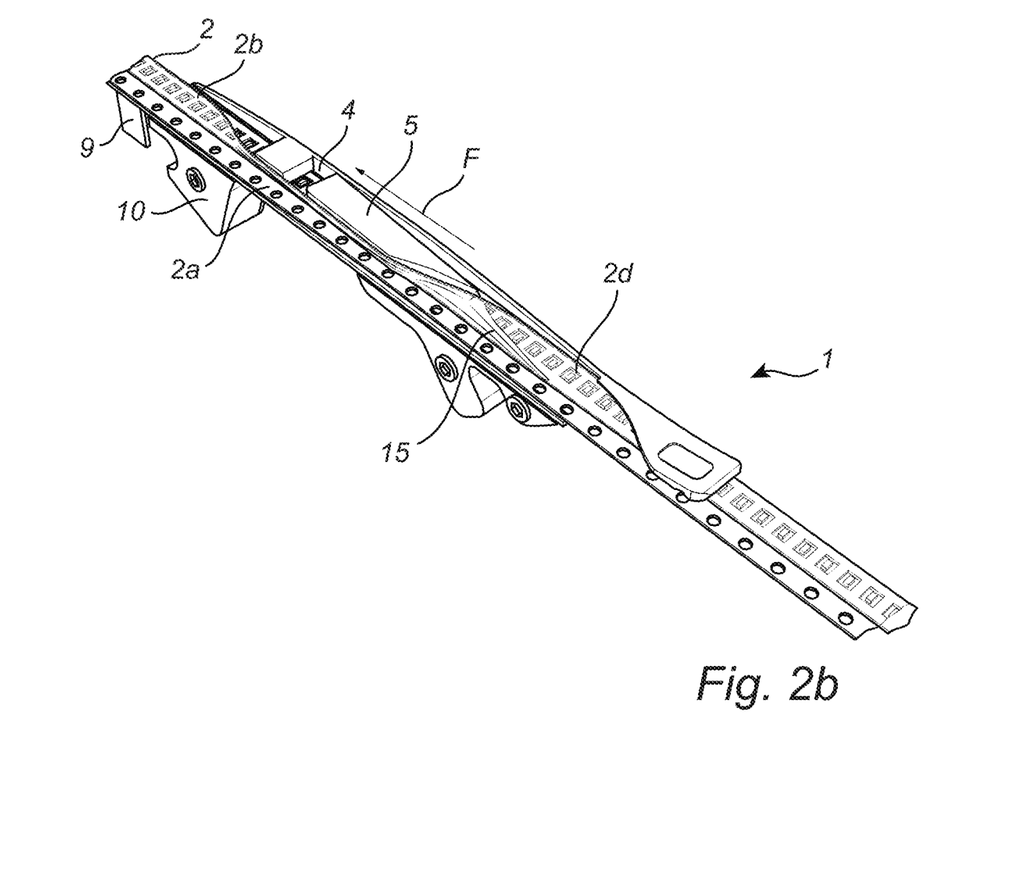

With reference to FIGS. 2a and 2b, a perspective view of a portion of a tape guide 1, exposure member 5 and picking position 4 is shown. FIGS. 2a and 2b also illustrate an example of the component tape 2 mounted in a tape guide 1. The component tape 2 may be inserted into the tape guide 1 in the feeding direction F. During use, the cover tape 2b may be lifted by the exposure member 6 as component tape 2 is fed forward in the feeding direction F by means of a feeding mechanism (not shown), which may be arranged in the tape guide or e.g. in other parts of a component mounting machine.

As mentioned above, the exposure member 5 may be located upstream from the picking position 4 when looking in the feeding direction F. The exposure member 5 comprises in this example a separating portion 15 which may have an edge 16 for pushing aside a tape cover 2b from the carrier tape 2a. The exposure member 5 may further comprise a gradually increasing vertical thickness in the feeding direction F, which allows the detached side of the cover tape 2b to be lifted from the carrier tape 2a. The thicker end of the exposure member 5 may be wide enough to allow the cover tape 2b to be completely lifted from sequentially arranged compartments (2c) of the carrier tape 2a, and the components 2d comprised therein, at the picking position 4. The exposure member 6 may separate and lift the tape cover 2b from the carrier tape 2a in such a way that the tape cover 2b forms at least a perpendicular angle, i.e. an angle that is at least 90 degrees, with the carrier tape 2a to ensure that the pickable surface of the components 2d is completely free of any tape cover obstruction at the picking position 4, thus allowing for the risks of picking malfunctions to be reduced.

As illustrated in FIG. 1, the tape guide 1 further comprises a hook portion 9 that is arranged at the downstream end portion 8 of the tape guide 1. The hook portion 9 is configured to grip a flange 3a of a tape reel. The hook portion may thus be used for attaching the tape guide 1 to a tape reel when the tape guide 1 and tape reel are removed from a component mounting machine, such as during storage, transport or manual handling of the reel and tape guide. The hook portion 9 are in the embodiments shown in FIGS. 1-2 arranged on the outer surface 10 of the tape guide 1, such as on the outer surface of the support structure 6. Further, the tape guide as illustrated in FIGS. 1-2 comprises a single hook portion 9 that is arranged at the downstream end portion 8 and configured to grip a flange of a tape reel. Thus, the upstream end portion 7 may be free of any hook portion 9 that is configured to grip the flange of a tape reel.

However, the tape guide may comprise hook portions 9 at both the downstream end portion 8 and the upstream end portion 7. This is illustrated in the embodiment illustrated in FIG. 3, in which the hook portions 9 at the downstream end portion 8 and the upstream end portion 7 are protruding portions of the support structure 6. These form a permanent receiving slit 11 for a flange of a tape reel. Thus, the receiving slits are present also when the tape guide 1 is not attached to a tape reel.

Figure 3:
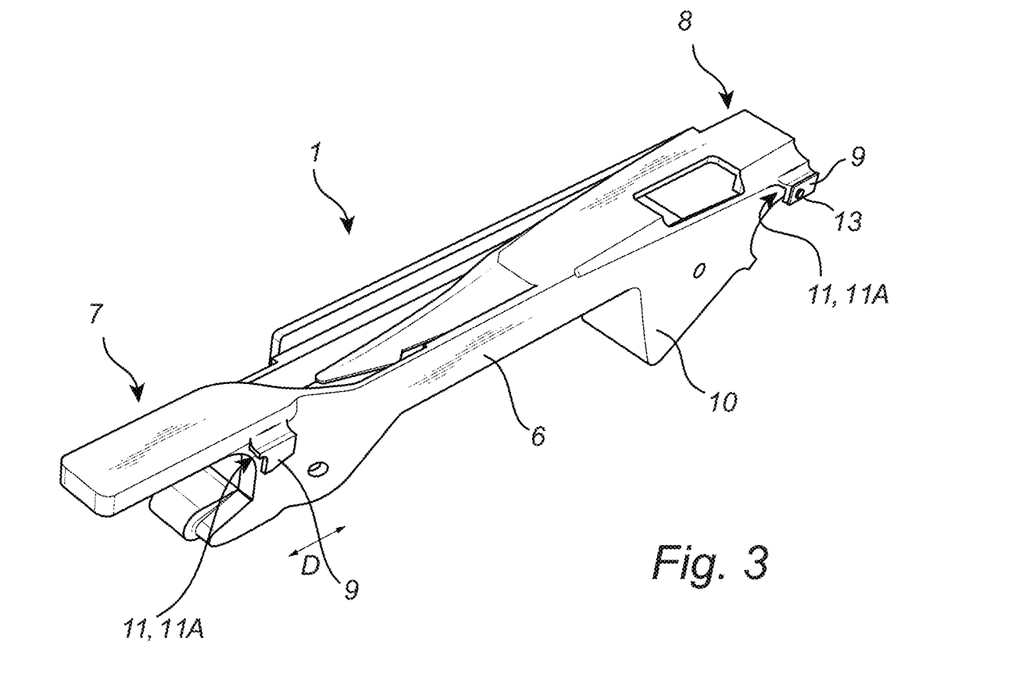
FIG. 3 is an illustration of a tape guide according to an embodiment of the present invention.

The receiving slit may thus be defined between a hook portion 9 and the outer surface 10 of the support structure 6. A receiving slit 11 extend in the direction (D) between the upstream 7 and downstream 8 end portions of the tape guide 1 so that the tape guide may conveniently be aligned in a tangential direction to the periphery of a tape reel when attached to a flange of a tape reel. Furthermore, a receiving slit 11 may have at least one rough inner surface 11A for increasing the friction against the surface of a reel flange, thereby increasing the grip strength of the hook portion 9, and thus the entire tape guide 1, to the reel.

As also is illustrated in FIG. 3, the tape guide may comprise a magnet 13 arranged for increasing the grip strength to a flange of a tape reel. The magnet 13 is attached or integrated in the hook portion 9 arranged at the downstream end portion 8, and may thereby increase the grip strength to e.g. a metallic flange of a tape reel.

Figures 4A, 4B:
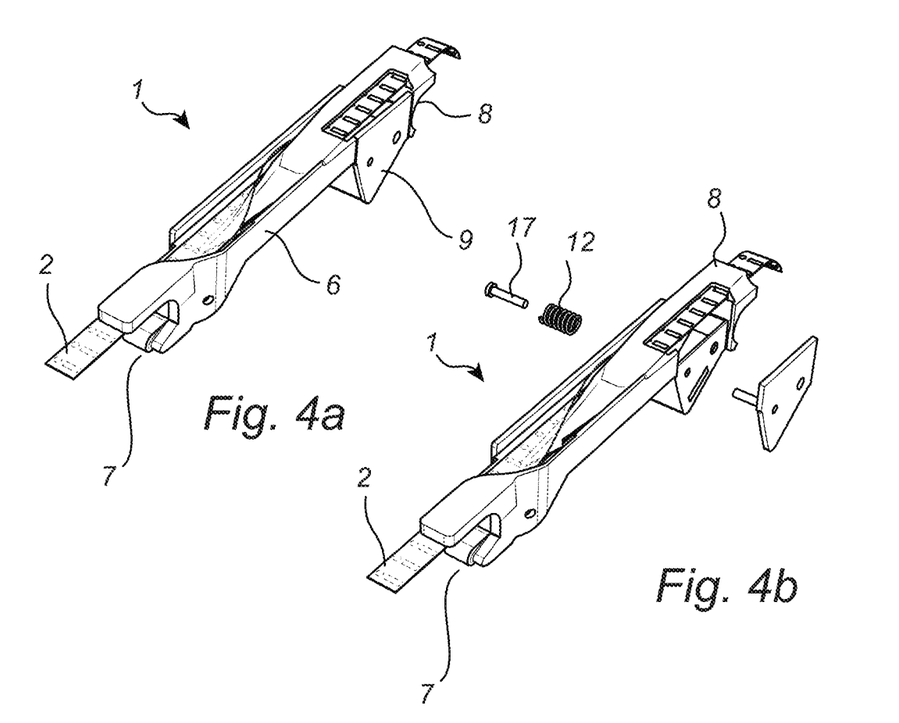
Figure 5:
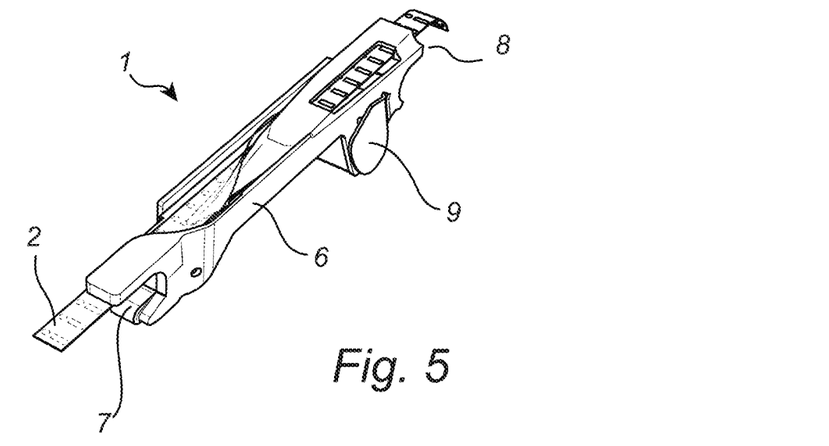
FIG. 5 is an illustration of a tape guide according to an embodiment of the present invention.

FIGS. 4a and 4b show an embodiment of a tape guide comprising a hook portion 9 that is spring loaded at the downstream end portion 8 of the tape guide 1. Thus, a receiving slit for a flange of a tape reel is formed as the spring is stretched from a resting position, and it may thus provide for increasing the grip strength of the hook portion 9 by exerting an opposing force against the surface of the reel during attachment of the tape guide to the reel. In the embodiment illustrated in FIGS. 4a and 4b, the hook portion 9 is a separate piece that is spring loaded with a spring member 12 at the downstream end portion 8 of the tape guide 1. The spring 12 is secured to the tape guide using securing member 17, e.g. in the form of a screw. It is to be understood that the shape of the hook portion 9 may be varied. In FIGS. 4a and 4b, the hook portion is in the form such that it follows the outer surface of the support structure. Also FIG. 5 shows an embodiment a tape guide comprising a hook portion 9 that is spring loaded at the downstream end portion 8 of the tape guide. In FIG. 5, the hook portion 9 has a rounded form. The shape of the hook portion may depend on the type of reel onto which the tape guide is to be attached. The shape and size of the hook portion may be so that it does not interfere with neighbouring mechanic parts when the tape reel is mounted in a component mounting machine.

As an example, the hook portion may have a size such that it allows for neighbouring tape guides to be stacked at a distance that is equal or less than 10 mm from each other when the tape guides is attached to the flange of a tape reel.

Figure 6:
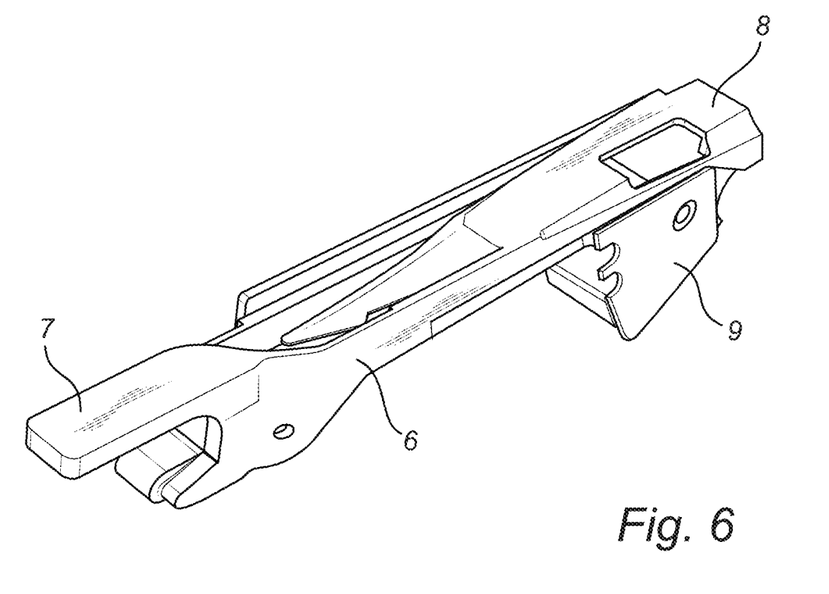
FIG. 6 is an illustration of a tape guide according to an embodiment of the present invention.

FIG. 6 shows another example of a tape guide 1 having a spring loaded hook portion 9. In this embodiment, the hook portion 9 is a flexible portion of the tape guide, such as a flexible portion of the support structure 6. The flexible portion forms a portion of the outer surface that may be bent outwards, i.e. away from the outer surface of the tape guide, and may when gripping a flange of a reel exert an opposing force against the surface of the flange, thereby increasing the grip strength. The flexible portion 9 may thus form a non-coiled spring portion of the tape guide, such as a non-coiled spring portion of the support structure.

Figures 7A, 7B:
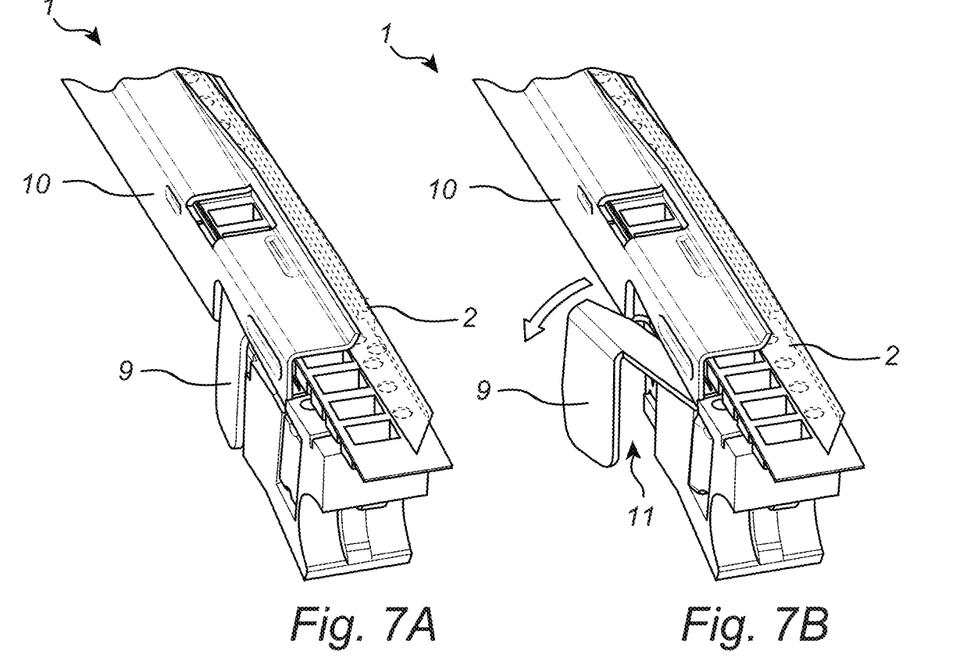
FIGS. 7a-7c are further illustrations of a tape guide according to an embodiment of the present invention.
Figure 7C:
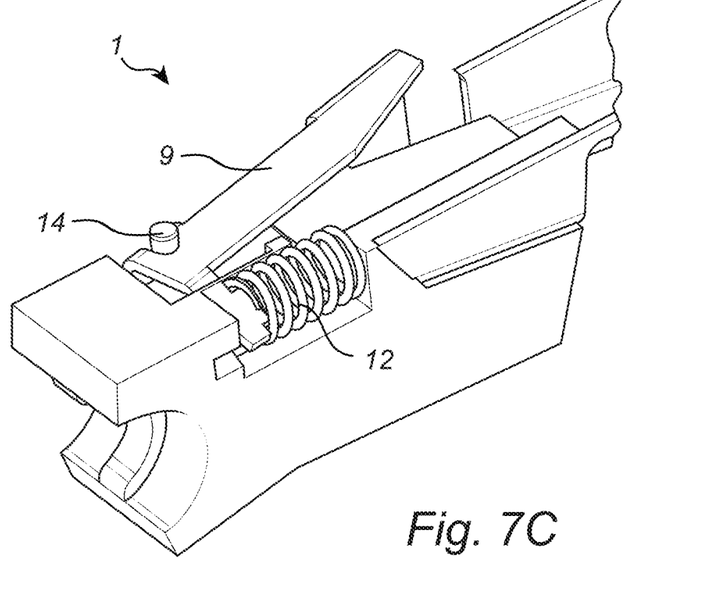

FIGS. 7a-7c show an embodiment of a tape guide 1 of the present invention in which the hook portion 9 is a separate piece that is attached to the support structure 6 via at least one hinge portion 14. The hinge portion 14 may be in the form of a hinge pin, see FIG. 7c, that is attached to the tape guide so that the separate hook portion 9 may be bent out and away from the surface 10 of the tape guide 1 (se FIG. 7b). The hinge pin 14 may be arranged in a direction that is perpendicular to the feeding direction of the tape guide 1. Using a hinge portion makes it possible for the tape guide to be in two permanent operational positions; a first attaching position in which the hook portion 9 is extended outwards from the outer surface of the tape guide 1 via the at least on hinge portion 14 and thereby able to grip the flange of a tape reel, as illustrated in FIG. 7b. The hook portion 9 thus forms a receiving slit 11 as discussed above when in the attaching position. The tape guide 1 may also be in a second, resting position in which the hook portion 9 is retracted to or into the outer surface 10 of the tape guide 1, as illustrated in FIG. 7a.

As illustrated in FIG. 7c, the hook portion 9 attached using hinge portion 14 may also be spring loaded. For example, a coiled spring 12 may be used to spring load the hook portion 9, thereby increasing the gripping force when attached to a flange of a tape reel. The coiled spring 12 may for example be arranged so that it extends in the direction form the downstream end portion to the upstream end portion of the tape guide 1, such as parallel to a receiving slit that is formed when the hook portion 9 is bent out from the surface.

Figure 8:
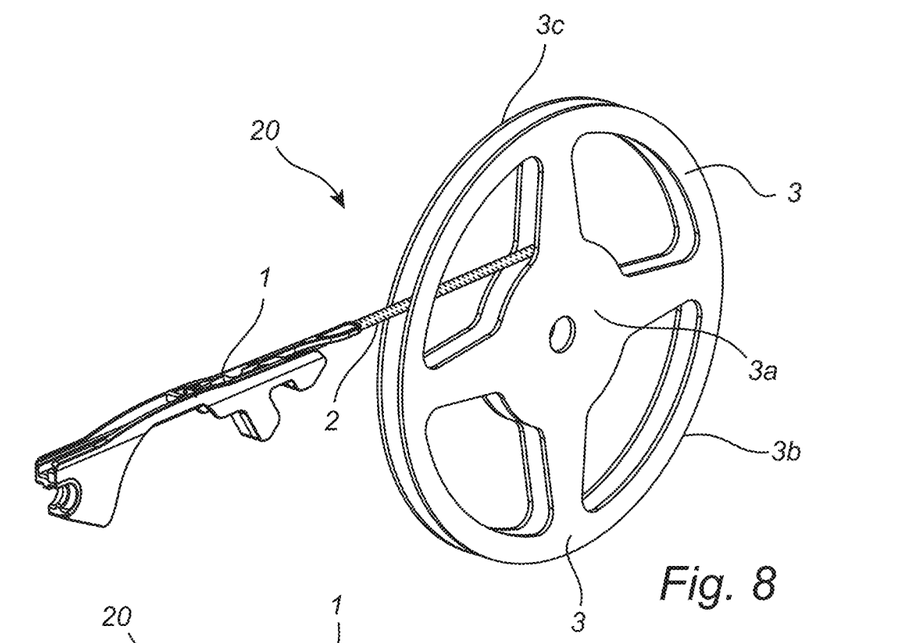
FIG. 8 shows an embodiment of a unit comprising a tape reel, component tape and tape guide.

FIG. 8 illustrates a unit 20 according to the present invention for guiding a component tape 2 to a picking position 4 of a component mounting machine. The unit comprises a tape reel 3 and a tape guide 1 according to the present disclosure.

The unit also comprises a component tape 2 wound around the tape reel 3 and guided into the tape guide 1 at the upstream end portion 7 of said tape guide 1. The tape reel 3 is configured such that lengths of a component tape 2 is wound around a hub, such as core portion 3a of the reel 3 during storage. The core portion 3a may be sandwiched between two thin disc members with flanges 3b and 3c for protection of the component tape 2 during storage. As illustrated in FIG. 8, the disc members may be circular disc members.

Figure 9:
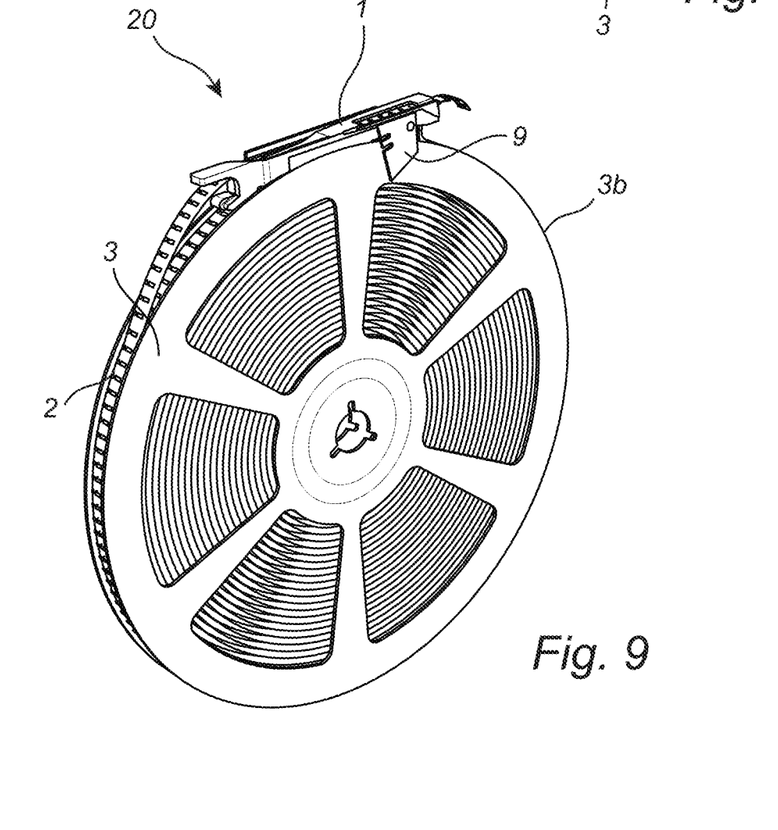
FIG. 9 shows the unit as illustrated in FIG. 8 when the tape guide is attached to the tape reel.

FIG. 9 shows the unit 20 as discussed in relation to FIG. 8 above when the tape guide 1 is attached to a flange 3b via a hook portion 9. As seen in FIG. 9, the hook portion 9 of the tape guide 1 of present invention is configured to grip a flange 3b of a tape reel 3, thereby fastening the tape guide 1 to a tape reel 3. When the tape guide 1 is attached to the flange 3b of the tape reel via a hook portion 9 arranged at the downstream end of the tape guide, there is little risk of bending a component tape 2 even when there is little tape wound around the core portion 3a of the tape guide 3.

Figure 10A:
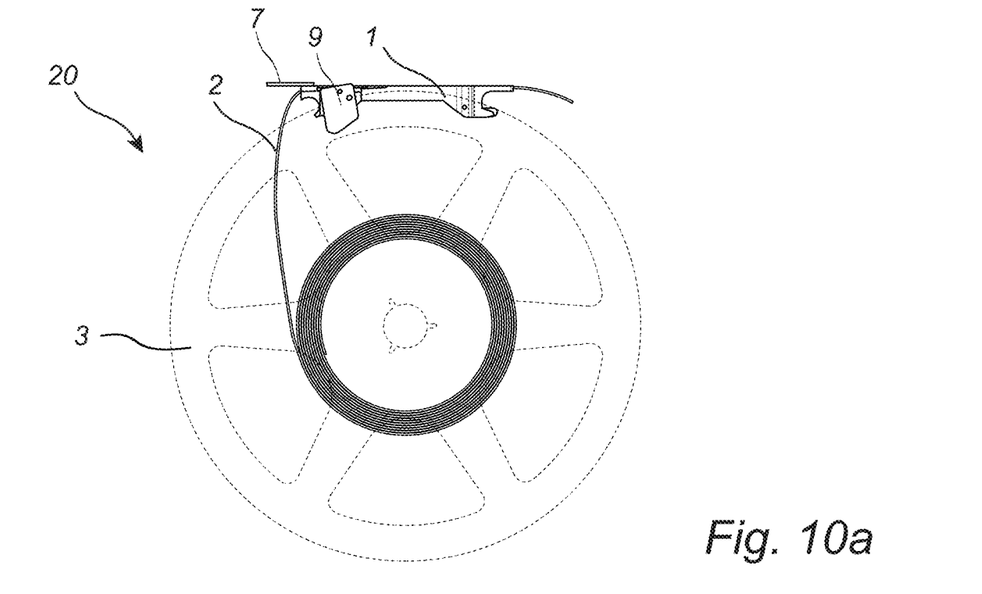
FIG. 10a-b show units comprising a tape reel, component tape and tape guide.
Figure 10B:
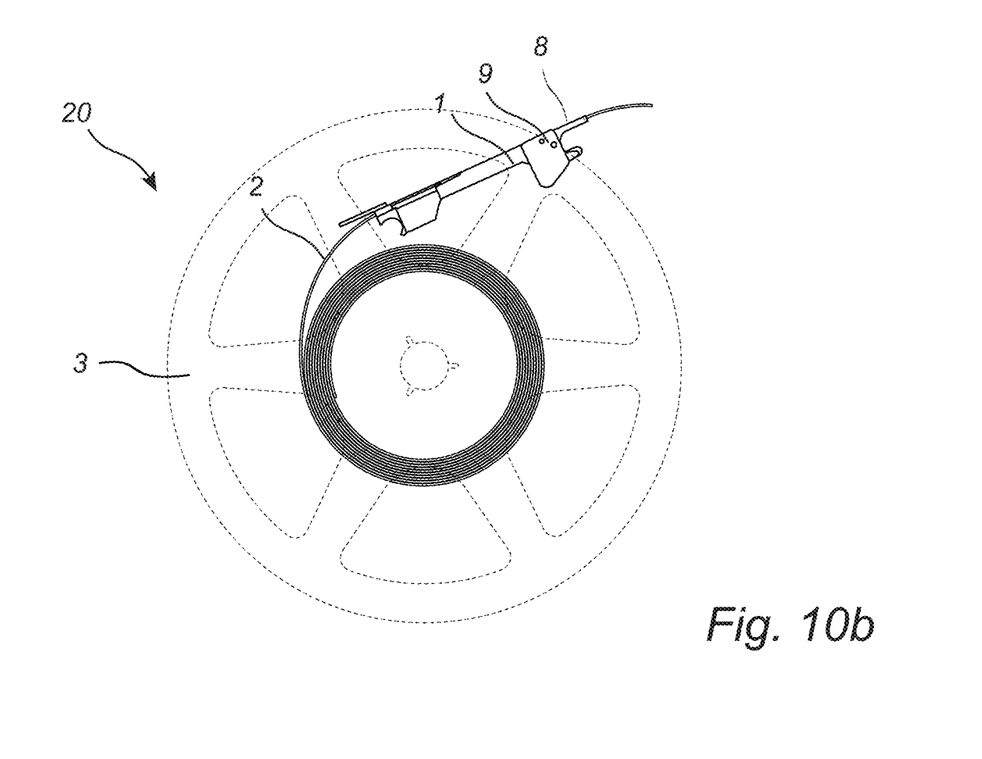

FIGS. 10a and 10b illustrate the difference of having the hook portion 9 attached at the upstream end portion 7 of the tape guide (FIG. 10a) as compared to having the hook portion 9 attached to the downstream end portion 8 (10b) in a unit 20.

In the unit 20 illustrated in FIG. 10a, the component tape 2, which is wound around the tape reel 3, is guided into the tape guide 1 at the upstream end portion 7. The tape guide 1 of the unit 20 in FIG. 10a has a hook portion 9 solely at the upstream end portion 7 and when there is little component tape 2 wound around the tape reel 3, the risk of bending the component tape 2 is increased, especially at the position where the component tape is guided into the upstream end portion 7 of the tape guide 1. Having a bent component tape 2 may have severe consequences in a pick-and-place machine, since it may cause a machine breakdown and require manual clearing of the component feeding components of the machine.

In contrast, the tape guide 1 of the unit 20 illustrated in FIG. 10b has a hook portion 9 solely at the downstream end portion 8. As seen in FIG. 10b, this is gentler to the component tape 1 when there is little component tape 1 wound around the tape reel 3. In other words, there is a smoother transition of the component tape 2 from the tape reel 3 to the tape guide 1 when there is little tape on the reel 3, thereby decreasing the risk of the component tape being bent.

Figure 11:
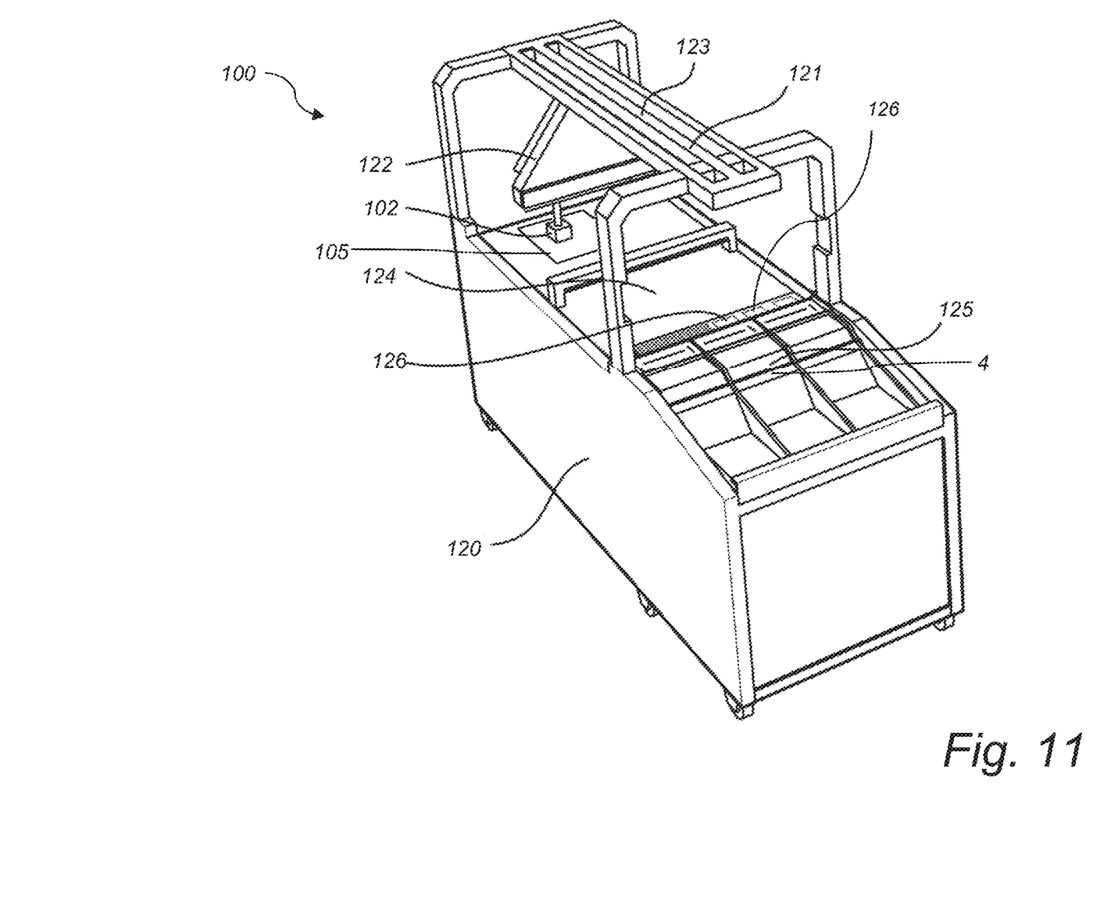
FIG. 11 shows an embodiment of a component mounting machine.

A schematic example of a component mounting machine 100 of the present disclosure is shown in FIG. 11 of the attached drawings. The component mounting machine 100 comprises a machine frame 120 arranged for receiving a source of electronic components, such as electronic components mounted in tape reels and magazines. These may for example be arranged within a feeder area 125 of the machine frame 120. Thus, units 20 of the present invention, comprising tape reels and tape guides, may be releasably mounted in magazines located at the feeder area of the machine 1.

The machine 100 further comprises a gantry system 121 having a first beam, or X beam 122, and a second perpendicular beam, or Y beam 123, attached to the machine frame 120, a picking tool 102 movably attached to the X beam 122, and a board transportation system 124, attached to the machine frame 120. The electronic components are presented to the picking tool 102 from the tape guide 1 at a picking position 4 of the component mounting machine 100. The board transportation system 124 transports workpieces 105, such as PCBs, between a conveyor line and a working area of the component mounting machine 100. The gantry system 121 makes it possible to move the picking tool 102 between the picking position 4 and the workpiece 105. Further, the picking tool 102 is arranged in a component mounting arrangement that is movable in the vertical direction, and is also able to rotate around a vertical axis. It also contains a suction device. This makes it possible to pick up, by activating the suction device, electronic components from the component tape at the picking position 4, transport them to the workpiece 105, and place them at a precise location on a surface of the workpiece 105. During the transport from pick up to the workpiece 105 a vision centering device 126 is passed to get an accurate position of picked electronic components.

In the above the inventive concept has mainly been described with reference to a limited number of examples. However, as is readily appreciated by a person skilled in the art, other examples than the ones disclosed above are equally possible within the scope of the inventive concept, as defined by the appended claims.

The invention claimed is:

1. A tape guide for guiding a component tape wound around a core portion sandwiched between two disc members of a tape reel to a picking position of a component mounting machine, said tape guide comprising:
   a support structure arranged for guiding the component tape from an upstream end portion of the tape guide to a downstream end portion of the tape guide; and a hook portion arranged at the downstream end portion and configured to grip an outer periphery of at least one of the two disc members when the tape guide and tape reel are removed from said component mounting machine, wherein the hook portion and an outer surface of the support structure define a receiving slit for the outer periphery between the hook portion and the outer surface of the support structure when the hook portion grips the outer periphery, and wherein the receiving slit extends in a direction between said upstream and downstream end portions of the tape guide.

2. The tape guide according to claim 1, wherein the hook portion is arranged on the outer surface of the support structure.

3. The tape guide according to claim 1, wherein the receiving slit has at least one rough inner surface for increasing friction against a surface of the outer periphery.

4. The tape guide according to claim 1, wherein the hook portion is spring loaded at the downstream end portion of the tape guide.

5. The tape guide according to claim 4, wherein the hook portion is a flexible portion of the support structure.

6. The tape guide according to claim 4, wherein the hook portion is a separate piece that is spring loaded with a spring member at the downstream end portion of the tape guide.

7. The tape guide according to claim 1, wherein the hook portion is a protruding portion of the support structure such that the defined receiving slit is a permanent receiving slit for the outer periphery.

8. The tape guide according to claim 1, wherein the hook portion is a separate piece that is attached to the support structure via at least one hinge portion.

9. The tape guide according to claim 1, wherein the hook portion comprises a magnet arranged for increasing a grip strength to the outer periphery.

10. The tape guide according to claim 1, wherein the hook portion is a single hook portion configured to grip the outer periphery of the at least one of the two disc members, and wherein said single hook portion is arranged at the downstream end portion of said tape guide.

11. A unit for guiding a component tape to a picking position of a component mounting machine, the unit comprising:
 a tape reel;
 the tape guide according to claim 1; and
 a component tape wound around a core portion sandwiched between two disc members of said tape reel and guided into the tape guide at the upstream end portion of said tape guide.

12. The unit according to claim 11, wherein the hook portion of the tape guide grips an outer periphery of at least one of the two disc members.

13. A component mounting machine comprising at least one unit according to claim 11 releasably mounted in said component mounting machine.

* * * * *